(12) United States Patent
Metzmacher et al.

(10) Patent No.: US 8,891,058 B2
(45) Date of Patent: Nov. 18, 2014

(54) EXTREME UV RADIATION GENERATING DEVICE COMPRISING A CONTAMINATION CAPTOR

(75) Inventors: Christof Metzmacher, La Calamine (BE); Achim Weber, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 782 days.

(21) Appl. No.: 13/003,950

(22) PCT Filed: Jul. 10, 2009

(86) PCT No.: PCT/IB2009/053009
§ 371 (c)(1),
(2), (4) Date: Apr. 8, 2011

(87) PCT Pub. No.: WO2010/007569
PCT Pub. Date: Jan. 21, 2010

(65) Prior Publication Data
US 2011/0181848 A1    Jul. 28, 2011

(30) Foreign Application Priority Data

Jul. 18, 2008   (EP) .................................. 08104787

(51) Int. Cl.
*G03B 27/42*   (2006.01)

(52) U.S. Cl.
USPC ................... 355/53; 355/30; 355/67; 355/71; 378/156; 378/158; 378/147; 378/85; 378/119

(58) Field of Classification Search
CPC ....... H05G 2/003; H05G 2/005; H05G 2/001; G03F 7/70033; G03F 7/70916; G03F 7/20; G03F 7/00; H05H 1/24

USPC .......... 355/30, 53, 67, 71; 378/156, 158, 147, 378/148, 149, 85, 119; 250/492.1, 492.2, 250/504 R, 396 R, 493.1, 461.1
See application file for complete search history.

(56) References Cited

U.S. PATENT DOCUMENTS

| 4,723,262 A * | 2/1988 | Noda et al. ..................... 378/119 |
| 6,359,969 B1 * | 3/2002 | Shmaenok .................... 378/156 |
| 6,647,088 B1 * | 11/2003 | Schmidt et al. .................. 378/34 |
| 2004/0141165 A1 * | 7/2004 | Zukavishvili et al. .......... 355/53 |
| 2005/0244572 A1 | 11/2005 | Bristol et al. |
| 2006/0192155 A1 | 8/2006 | Algots et al. |
| 2007/0018119 A1 | 1/2007 | Yabuta et al. |
| 2008/0006783 A1 | 1/2008 | Hergenhan et al. |

FOREIGN PATENT DOCUMENTS

| DE | 19743311 A1 | 4/1998 |
| EP | 1804556 A2 | 7/2007 |
| GB | 2204063 A | 11/1988 |
| WO | 2004062050 A2 | 7/2004 |
| WO | 2005025280 A2 | 3/2005 |
| WO | 2006123270 A2 | 11/2006 |
| WO | 2007002170 A2 | 1/2007 |
| WO | 2009108049 A1 | 9/2009 |

OTHER PUBLICATIONS

S.-Y Lin et al: "Measurement of Dynamic/Advancing/Receding Contack Angle by Video-Enhanced Sessile Drop Tensionmetry", Rev. Sci. Instrument, vol. 67, No. 8, pp. 2852, 1996.

* cited by examiner

*Primary Examiner* — Ton Minh-Toan
*Assistant Examiner* — Mesfin T Asfaw

(57) ABSTRACT

The invention relates to an improved EUV generating device having a contamination captor for "catching" contamination and/or debris caused by corrosion or otherwise unwanted reactions of the tin bath.

7 Claims, 2 Drawing Sheets

EXTREME UV RADIATION GENERATING DEVICE COMPRISING A CONTAMINATION CAPTOR

FIELD OF THE INVENTION

The invention relates to extreme UV radiation generating devices, especially EUV radiation generating devices which make use of the excitation of a tin-based plasma.

BACKGROUND OF THE INVENTION

This invention relates to extreme UV radiation generating devices. These devices are believed to play a great role for the upcoming "next generation" lithography tools of the semiconductor industry.

It is known in the art to generate EUV light e.g. by the excitation of a plasma of an EUV source material which plasma may be created by a means of a laser beam irradiating the target material at a plasma initiation site (i.e., Laser Produced Plasma, 'LPP') or may be created by a discharge between electrodes forming a plasma, e.g., at a plasma focus or plasma pinch site (i.e., Discharge Produced Plasma 'DPP') and with a target material delivered to such a site at the time of the discharge.

However, in both techniques a flow of liquid tin, which is supposed to be one of the potential target materials, is required, i.e. that certain parts of the EUV generating device are constantly exposed to relatively harsh chemical and physical conditions at elevated temperatures of greater than e.g. 200° C.

To further complicate the situation there is also the prerequisite that the tin needs to be free from contamination and/or debris in order to secure a high quality of a pure tin plasma.

SUMMARY OF THE INVENTION

It is an object of the present invention to provide an extreme UV radiation generating device which is capable of providing a less contaminated flow of tin to and from the plasma generating part of said device.

This object is solved by an extreme UV radiation generating device according to claim 1 of the present invention. Accordingly, an extreme UV radiation generating device is provided, comprising a plasma generating device, at least one tin supply system having a supply reservoir in fluid communication with said plasma generating device adapted to supply said plasma generating device with liquid tin, whereby said tin supply system comprises at least one supply means for the supply of tin, furthermore comprising at least one contamination captor at least partly in contact with the tin supplied in said supply means, whereby said contamination captor
- is equipped at its outer surface at least partly, preferably essentially with a material which has a contact angle of ≤90° to a liquid phase of the system of tin and iron and/or to the combination of liquid tin and the corrosive reaction product $FeSn_2$; and
- is capable of being moved with a speed of ≥1 mm/s and ≤50 mm/s The term "plasma generating device" in the sense of the present invention means and/or includes especially any device which is capable of generating and/or exciting a tin-based plasma in order to generate extreme UV light. It should be noted that the plasma generating device of this invention can be any device known in the field to the skilled person.

The term "tin supply system" in the sense of the present invention means and/or includes especially any system capable of generating, containing and/or transporting liquid tin such as e.g. heating vessels, delivery systems and tubings.

The term "supply means" in the sense of the present invention means and/or includes especially at least one vessel and/or at least one reservoir and/or at least one tubing capable of generating, containing and/or transporting liquid tin.

The term "contamination captor" in the sense of the present invention especially means and/or includes any means capable of binding at least part of, preferably essentially all of the contamination and/or debris present in the tin bath and/or tin supply means due to corrosion and/or unwanted reaction(s).

The term "equipped" in the sense of the present invention especially means that the contamination captor is coated with the contamination captor material with a low contact angle. However, this is just one embodiment of the present invention and the term "equipped" is also intended to include embodiments, where the contamination captor is made at least partly of the contamination captor material with a low contact angle.

The term "at least partly" especially means ≥50% ($m^2/m^2$), preferably 65% ($m^2/m^2$) of the outer surface, the term "essentially" especially means ≥80% ($m^2/m^2$), preferably ≥90% ($m^2/m^2$), more preferred ≥95% ($m^2/m^2$) and most preferred ≥98% ($m^2/m^2$) of the outer surface.

The term "moved" especially includes a periodical movement like a circular movement and/or an oscillating movement. It should be noted that "moving" in the sense of the present invention may include that the contamination captor is present in the liquid tin all the time or essentially all the time; on the other hand, this is just an embodiment of the present invention and the contamination captor may also move in a pattern that it e.g. periodically leaves the tin bath.

The use of such an extreme UV radiation generating device has shown for a wide range of applications within the present invention to have at least one of the following advantages:
- Due to the contamination captor the contamination of tin may be greatly reduced, thus increasing both the lifetime and the quality of the EUV device
- Due to the contamination captor the contamination of tin may be greatly reduced, thus increasing the purity ("cleanliness" of the radiation) of the EUV emission itself
- Due to the contamination captor the contamination of tin may be greatly reduced, thus maintaining the high quality and purity of the liquid tin itself over a prolonged time, thus avoiding a regular change of the tin itself
- Due to the contamination captor the fabrication of the supply means itself becomes cheaper and handling becomes easier (e.g. with respect to mechanics) as the base material can be applied and be coated ready in shape just prior to be used in the EUV device
- Due to the contamination captor there is no dedicated adhesion promoter required to be used to remove contaminants from the contaminated liquid
- Due to the contamination captor it is possible to apply all kinds of geometric arrangements of the getter, i.e., even complex or very simple arrangements can be realized According to an embodiment of the present invention, the contamination captor is equipped with a material with a contact angle of ≤80°, preferably ≤70° and most preferred ≤60°.

According to an embodiment of the present invention, the contamination captor is capable of being moved with a speed of ≥10 mm/s and ≤30 mm/s, preferably >1 mm/s and <10 mm/s, most preferably ≥1 mm/s and ≤1 mm/s.

According to an embodiment of the present invention, the at least one contamination captor is provided in a distance of ≥10 mm and ≤2 cm, preferably ≥20 mm and ≤1 cm, more preferred ≥30 mm and ≤100 mm and most preferred ≥50 mm and ≤80 mm of a wall of the tin supply system. This has been shown to be more effective for many applications within the present invention.

According to an embodiment of the present invention, the contamination captor material with a low contact angle includes, preferably is essentially made of at least one covalent inorganic solid material.

The term "covalent inorganic solid material" especially means and/or includes a solid material whose elementary constituents have a value in the difference of electronegativity of ≤2 (Allred & Rochow), preferably in such a way that the polar or ionic character of the bonding between the elementary constituents is small.

According to a preferred embodiment of the present invention, at least one covalent inorganic solid material comprises a solid material selected from the group of oxides, nitrides, borides, phosphides, carbides, sulfides, silicides and/or mixtures thereof.

These materials have proven themselves in practice especially due to their good anti-corrosive properties.

According to a preferred embodiment of the present invention, the covalent inorganic solid material comprises at least one material which has a melting point of ≥1000° C.

By doing so especially the long-time performance of the EUV-generating device can be improved.

Preferably the covalent inorganic solid material has a melting point of ≥1000° C., more preferred ≥1500° C. and most preferred ≥2000° C.

According to a preferred embodiment of the present invention, the covalent inorganic solid material comprises at least one material which has a density of ≥2 g/cm$^3$ and ≤8 g/cm$^3$.

By doing so especially the long-time performance of the EUV-generating device can be improved.

Preferably the covalent inorganic solid material comprises at least one material with a density of ≥2.3 g/cm$^3$, more preferred ≥4.5 g/cm$^3$ and most preferred ≥7 g/cm$^3$.

According to a preferred embodiment of the present invention, the covalent inorganic solid material comprises at least one material whose atomic structure is based on close packing of at least one of the atomic constituents of ≥60%. Package density is defined as the numbers of atomic constituents per unit cell times the volume of a single atomic constituent divided by the geometric volume of the unit cell.

By doing so especially the long-time performance of the EUV-generating device can be improved.

Preferably the covalent inorganic solid material comprises at least one material with a package density of ≥65%, more preferred ≥68% and most preferred ≥70%.

According to a preferred embodiment of the present invention, the covalent inorganic solid material comprises of material which does not show a thermodynamic phase field of atomic constituents and tin in the target temperature range resulting from a chemical reaction between one of the atomic constituents and tin, i.e. the covalent inorganic solid material has a high chemical inertness against liquid tin.

By doing so especially the long-time performance of the EUV-generating device can be improved.

Preferably the covalent inorganic solid material comprises at least one material selected out of the group comprising oxides, nitrides, borides, phosphides, carbides, sulfides, and silicides of Mg, Al, Si, K, Ca, Sc, Ti, V, Cr, Mn, Fe, Co, Ni, Cu, Zn, Ga, Ge, Y, Zr, Nb, Mo, Tc, Ru, Rh, Pd, Ag, Cd, In, Sn, La, Ce, Pr, Nd, Sm, Eu, Gd, Tb, Dy, Ho, Er, Tm, Yb, Lu, Hf, Ta, W, Re, Os, Ir, Pt, Au or mixtures thereof.

The covalent inorganic solid material can be synthesized by rather conventional production techniques, such as physical vapour deposition (PVD), e.g. evaporation, sputtering with and without magnetron and/or plasma assistance, or chemical vapour deposition (CVD), e.g. plasma-enhanced or low-pressure CVD, or molecular beam epitaxy (MBE), or pulsed laser deposition (PLD), or plasma spraying, or etching (chemical passivation), or thermal annealing (thermal passivation), or via melting (e.g. emaille), or galvanic or combinations thereof, e.g. thermo-chemical treatments.

According to an embodiment of the present invention, the contamination captor material with a low contact angle includes, preferably is essentially made of at least one metal selected out of the group comprising IVb, Vb, VIb, and/or VIIIb metals, graphite or mixtures thereof.

The term "metal" in the sense of the present invention does not mean to be intended to limit the invention to embodiments, where said contamination captor is coated with a metal in pure form. Actually it is believed at least for a part of the metals according to the present invention that they may form a coating where there are constituents partly oxidized or otherwise reacted.

The invention furthermore relates to a method of cleaning and/or purifying tin in an extreme UV radiation generating device, comprising a plasma generating device, at least one tin supply system having a supply reservoir in fluid communication with said plasma generating device adapted to supply said plasma generating device with liquid tin, whereby said tin supply system comprises at least one supply means for the supply of tin, and at least one contamination captor which is equipped at its outer surface at least partly, preferably essentially with a material which has a contact angle of ≤90° to a liquid phase of the system of tin and iron and/or to the combination of liquid tin and the corrosive reaction product FeSn$_2$; comprising the step of moving at least one contamination captor at least partly inside the liquid tin with a speed of ≥0.1 mm/s and ≤50 mm/s.

An extreme UV generating device according to the present invention may be of use in a broad variety of systems and/or applications, amongst them one or more of the following:
  semiconductor lithography
  metrology
  microscopy
  fission
  fusion
  soldering The aforementioned components, as well as the claimed components and the components to be used in accordance with the invention in the described embodiments, are not subject to any special exceptions with respect to their size, shape, compound selection and technical concept such that the selection criteria known in the pertinent field can be applied without limitations.

BRIEF DESCRIPTION OF THE DRAWINGS

Additional details, features, characteristics and advantages of the object of the invention are disclosed in the sub claims, the figures and the following description of the respective figures and examples, which—in an exemplary fashion—show several embodiments and examples of inventive compounds

In order to evaluate different materials, a material test stand was built. This device works in vacuum and allows test samples to be dipped into and slightly and slowly move in molten tin for a dedicated period of time.

Figure 1:
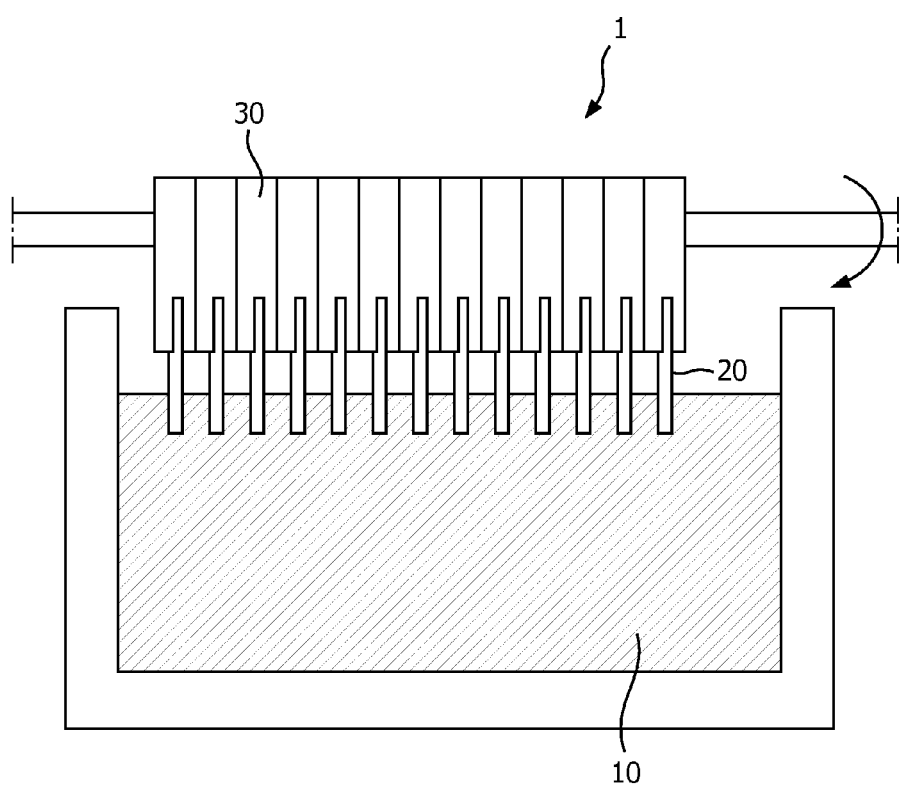
FIG. 1 shows a schematic figure of a material test stand which was used to evaluate the inventive (and comparative) examples of the present invention.
Figure 2:
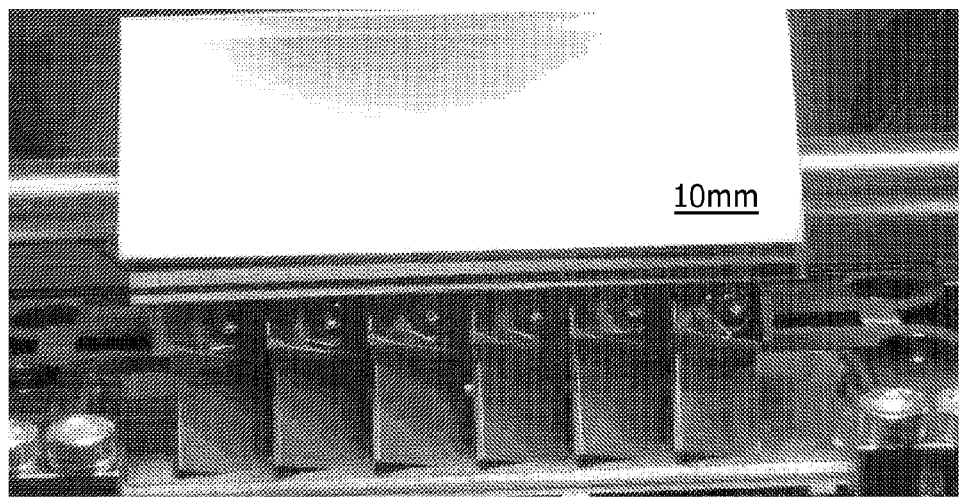
FIG. 2 shows a photograph of a test material prior the immersion.

The material test stand 1 is (very schematically) shown in FIG. 1 and comprises a tin bath 10, in which several test slides 20 which are mounted on a (turnable) holder 30 can be dipped at a controlled temperature. The dimension of the test slides will be approx. 30 mm×10 mm. FIG. 2 shows a photo of the test slides prior to immersion.

Figure 3:
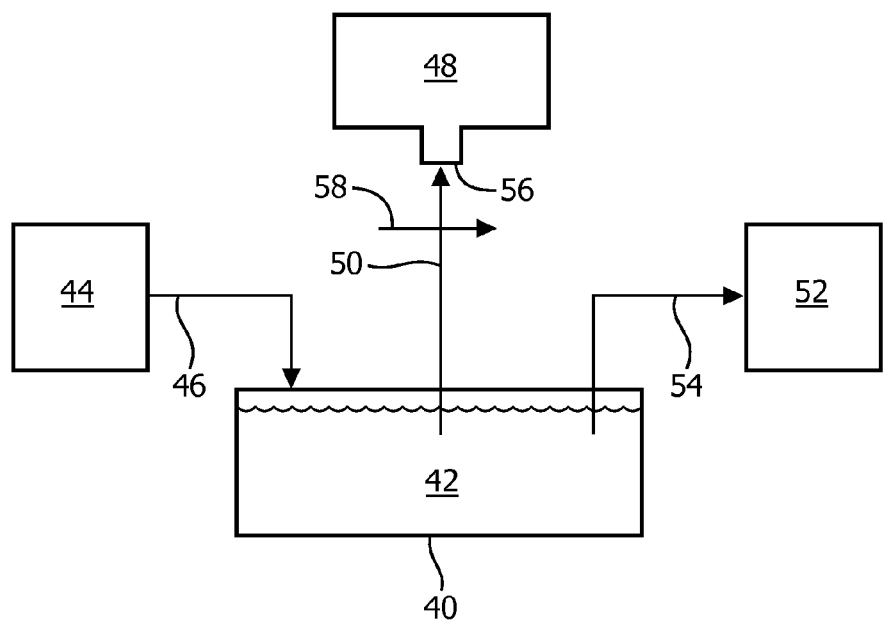
FIG. 3 illustrates a specific embodiment of the extreme UV generating device of the invention.

FIG. 3 illustrates a specific embodiment of the extreme UV generating device of the invention that the invention is not limited to. A tin supply system comprises: a tin supply reservoir 40 contains liquid tin 42, and a tin supply unit 44 supplies tin to the reservoir as indicated by arrow 46. A contamination captor 48 removes contamination from the liquid tin. Arrow 50 represents the removal of contaminates from the reservoir of liquid tin and that the contamination captor is at least partially in contact with the liquid tin. Plasma generating device 52 is for producing extreme UV light. Arrow 54 represents that plasma generating device 52 is in fluid communication with the liquid tin 42 of the tin supply reservoir 40. The contamination captor 48 has an outer surface 56 of a material which has a contact angle of ≤90° to a liquid phase of the system of tin and iron and/or to the combination of liquid tin and the corrosive reaction product $FeSn_2$, as measured for example, by video-enhanced sessile drop tensiometry; and the contamination captor is capable of being moved with a speed of 0.1 mm/s and ≤50 mm/s through the liquid tin as represented by arrow 58.

The temperature and atmosphere of the test stand is continuously logged and controlled.

The tin bath 10 was then controllably contaminated by introducing stainless steel. This was done by using test slides 20 which were made of stainless steel.

Afterwards, the ability to "catch" the contamination within the tin bath was used in that a new row of slides was dipped into the contaminated tin bath and moved with a velocity of 15 mm/s.

Table I shows the properties of two inventive and one comparative example

TABLE I

| MATERIAL | Inventive/Comparative | Contact angle | Behaviour |
| --- | --- | --- | --- |
| Graphite | INVENTIVE | approx. 50° | GOOD |
| Mo | INVENTIVE | approx. 60° | GOOD |
| TiAlN | COMPARATIVE | approx. 130° | NONE |

The following could be observed:

Inventive Materials (marked as "GOOD"): It was observed that these materials are capable to remove the contamination and corrosion products, probably due to the adhesion of the reaction product at the surface due to wetting. By this the corrosion products can be removed from the tin bath.

The comparative Material ("marked as NONE"): No change in the tin bath could be observed, i.e. the contamination was not removed.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

Materials and Methods

The contact angle can be measured according to S.-Y. Lin et al., Measurement of dynamic/advancing/receding contact angle by video-enhanced sessile drop tensiometry, Rev. Sci. Instrum., 67(8), pp. 2852, 1996, which is hereby incorporated by reference.

The invention claimed is:

1. Extreme UV radiation generating device comprising:
   a plasma generating device,
   at least one tin supply system having a supply reservoir in fluid communication with said plasma generating device adapted to supply said plasma generating device with liquid tin, wherein said tin supply system comprises at least one supply means for the supply of tin, and
   at least one contamination captor at least partly in contact with the tin supplied in said supply means, wherein said contamination captor:
      is equipped at its outer surface at least partly, essentially with a material which has a contact angle of ≤90° to a liquid phase of the system of tin and iron and/or to the combination of liquid tin and the corrosive reaction product FeSn2; and
      is capable of being moved with a speed of ≥0.1 mm/s and ≤50 mm/s.

2. The extreme UV radiation generating device of claim 1, wherein the contamination captor is equipped with a material with a contact angle of ≤80°.

3. The extreme UV radiation generating device of claim 1, wherein the contamination captor is capable of being moved with a speed of ≥10 mm/s and ≤30 mm/s.

4. The extreme UV radiation generating device of claim 1, wherein the at least one contamination captor is provided in a distance of ≥10 mm and ≤2 cm of a wall of the tin supply system.

5. The extreme UV radiation generating device according to claim 1, wherein the contamination captor material with a low contact angle includes, preferably is essentially made of, at least one covalent inorganic solid material.

6. A system comprising an extreme UV radiation generating device of claim 1, the system being used in one or more of the following applications:
   Semiconductor lithography,
   metrology,
   microscopy,
   fission,
   fusion,
   soldering.

7. A method of cleaning and/or purifying tin in an extreme UV radiation generating device comprising a plasma generating device, at least one tin supply system having a supply reservoir in fluid communication with said plasma generating device adapted to supply said plasma generating device with liquid tin, whereby said tin supply system comprises at least one supply means for the supply of tin, and at least one contamination captor which is equipped at its outer surface at least partly, essentially, with a material which has a contact angle of ≤90° to a liquid phase of the system of tin and iron and/or to the combination of liquid tin and the corrosive reaction product $FeSn_2$; the method comprising the step of:

moving at least one contamination captor at least partly inside the liquid tin with a speed of ≥0.5 mm/s and ≤10 mm/s.

\* \* \* \* \*